(12) United States Patent
Gong et al.

(10) Patent No.: US 12,735,805 B2
(45) Date of Patent: Sep. 15, 2026

(54) SUSPENDED LIFTING DEVICE FOR DIVERSION CYLINDER

(71) Applicant: TCL ZHONGHUAN RENEWABLE ENERGY TECHNOLOGY CO., LTD., Tianjin (CN)

(72) Inventors: Mingyang Gong, Tianjin (CN); Wenxia Zhang, Tianjin (CN); Qian Guo, Tianjin (CN); Shengli Wang, Tianjin (CN); Xuebing Kang, Tianjin (CN); Yanjie Zhou, Tianjin (CN); Peng Han, Tianjin (CN); Jinliang Qiao, Tianjin (CN); Lin Wang, Tianjin (CN); Haoping Shen, Tianjin (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 456 days.

(21) Appl. No.: 18/548,079

(22) PCT Filed: Jul. 31, 2023

(86) PCT No.: PCT/CN2023/110398

§ 371 (c)(1),
(2) Date: Aug. 26, 2023

(87) PCT Pub. No.: WO2024/045992

PCT Pub. Date: Mar. 7, 2024

(65) Prior Publication Data

US 2025/0019860 A1 Jan. 16, 2025

(30) Foreign Application Priority Data

Aug. 31, 2022 (CN) ........................ 202222301072.2

(51) Int. Cl.
*C30B 15/30* (2006.01)
*C30B 29/06* (2006.01)

(52) U.S. Cl.
CPC .............. *C30B 15/30* (2013.01); *C30B 29/06* (2013.01)

(58) Field of Classification Search
CPC .......... C30B 15/00; C30B 15/30; C30B 29/06
See application file for complete search history.

(56) References Cited

U.S. PATENT DOCUMENTS

2022/0042203 A1 2/2022 Yang et al.
2023/0243061 A1 * 8/2023 Cao ........................ C30B 15/30 117/217

FOREIGN PATENT DOCUMENTS

CN 206986325 U * 2/2018 ............ C30B 15/00
CN 216838266 U 6/2022

(Continued)

OTHER PUBLICATIONS

English computer translation of CN-206986325-U (Year: 2025).*

(Continued)

*Primary Examiner* — Matthew J Song
(74) *Attorney, Agent, or Firm* — PV IP PC; Wei Te Chung

(57) ABSTRACT

A suspended lifting device for diversion cylinder is provided, wherein the suspended lifting device includes a lifting beam connected to a surface of a water-cooling cross arm. A groove is provided on the lifting beam, and the groove is configured to receive a lifting bolt. A positioning plate is disposed on a bottom side of the lifting beam close to the water-cooling cross arm, and the positioning plate is configured to control an angle between the lifting beam and the water-cooling cross arm.

19 Claims, 2 Drawing Sheets

(56) References Cited

FOREIGN PATENT DOCUMENTS

| | | | | | |
|---|---|---|---|---|---|
| CN | 218345585 | U | | 1/2023 | |
| CN | 218345597 | U | | 1/2023 | |
| KR | 20010056550 | A | | 7/2001 | |
| WO | WO-2015147367 | A1 | * | 10/2015 | ............ C30B 15/14 |

OTHER PUBLICATIONS

English computer translation of WO-2015147367-A1 (Year: 2025).*
International Search Report in International application No. PCT/CN2023/110398, mailed on Oct. 17, 2023.
Written Opinion of the International Search Authority in International application No. PCT/CN2023/110398, mailed on Oct. 17, 2023.

* cited by examiner

SUSPENDED LIFTING DEVICE FOR DIVERSION CYLINDER

CROSS-REFERENCE TO RELATED DISCLOSURE

The present disclosure claims priority to Chinese Patent Application No. 202222301072.2, filed Aug. 31, 2022, titled "SUSPENDED LIFTING DEVICE FOR DIVERSION CYLINDER", which is incorporated herein by reference in its entirety.

TECHNICAL FIELD

The present disclosure relates to a technical field of a Czochralski single crystal equipment, and particularly relates to a suspended lifting device for diversion cylinder.

BACKGROUND

Czochralski growth of single crystal silicon is most widely used technology for producing single crystal silicon at present. With intensification of market competition, requirements on quality of single crystal silicon are more stringent, and requirements on quality of large-sized single crystal silicon are higher, and thus manufacturers with higher quality are needed. To maintain normal growth of single crystal, a diversion cylinder is added to play as one of important roles on current Czochralski single crystal.

In prior art, a structure of the diversion cylinder is bowl-shaped, an air flow in a furnace flows out through a lower opening of the diversion cylinder to uniformly flow through surface of a silicon liquid. Since an operation time of the furnace is long, a lower surface of the diversion cylinder is in a high-temperature region of a thermal filed for a long time. The silicon vapor from the liquid and manual overgrinding shortens service life of the diversion cylinder. A lower end of the diversion cylinder is aged and oxidized to cause a reflection and a blur in an inverted reflection of the diversion cylinder in liquid. As such, a distance to the lower opening of the diversion cylinder cannot be accurately positioned in actual application, and the distance cannot be accurately controlled in Czochralski growth of single crystal silicon, and finally, the lower end of the diversion cylinder is aged and slagged to seriously affect crystal formation.

SUMMARY

A suspended lifting device for diversion cylinder is provided, which effectively solves a problem that a distance to the lower opening of the diversion cylinder cannot be accurately positioned in actual application, and the distance cannot be accurately controlled in Czochralski growth of single crystal silicon, a lower surface of the diversion cylinder is in a high-temperature region of a thermal filed for a long time, the silicon vapor from the liquid and manual overgrinding shortens service life of the diversion cylinder, and finally, the lower end of the diversion cylinder is aged and slagged to seriously affect crystal formation.

A suspended lifting device for diversion cylinder is provided, wherein the suspended lifting device includes: a lifting beam connected to a surface of a water-cooling cross arm, wherein a groove is provided on the lifting beam, and the groove is configured to receive a lifting bolt; wherein a positioning plate is disposed on a bottom side of the lifting beam close to the water-cooling cross arm, and the positioning plate is configured to control an angle between the lifting beam and the water-cooling cross arm.

In an embodiment, a length of the lifting beam is X and a diameter of the water-cooling cross arm is Y, wherein X and Y satisfy with $1.5Y<X\leq 3Y$.

In an embodiment, the groove extends through a front side of the lifting beam to define the lifting beam U-shaped as a whole.

In an embodiment, the groove is U-shaped.

In an embodiment, inners of side walls of the groove are provided with arcuate surfaces to match the lifting bolt.

In an embodiment, a width of the groove matches a portion of the lifting bolt disposed in the groove.

In an embodiment, the width of the groove is greater than a diameter of the lifting bolt.

In an embodiment, the width of the groove is less than a diameter of a nut screwed with the lifting bolt.

In an embodiment, the diameter of the lifting bolt is D, and the width of the groove 2 satisfies with D+3 mm, and a depth of the groove 2 satisfies with 4D-6D.

In an embodiment, an upper side of the positioning plate is connected to a bottom side of the lifting beam close to the water-cooling cross arm, a rear side of the positioning plate is in contact with the water-cooling cross arm, and the upper side of the positioning plate is perpendicular to the rear side of the positioning plate.

In an embodiment, a width of the upper side of the positioning plate is greater than a half of a width of a portion of the lifting beam defined as a side wall of the groove.

In an embodiment, the suspended lifting device includes a projection for preventing the lifting bolt from falling, wherein the projection is provided on a front side of the lifting beam.

In an embodiment, the projection is protruded from the lifting beam.

In an embodiment, a distance of the projection protruding from the lifting beam is 3 mm to 5 mm.

The lifting device for the diversion cylinder as described above provides a more accurate means to adjust the position of the diversion cylinder by the matching of the lifting bolt and the lifting beam, so that a value of the horizontal deviation of the diversion cylinder is reduced from 11% to 5%, and a position deviation of a temperature-stabilizing crucible is reduced, the crystal-formation rate is improved, and the yield is improved.

A projection is provided on front side of the lifting beam to block the lifting bolt from leaving the groove and falling down during lifting, thereby avoiding an occurrence of anomalies.

BRIEF DESCRIPTION OF THE DRAWINGS

In order to make the embodiments of the present disclosure or the technical solutions in the prior art more clearly, reference will now be made to the accompanying drawings used in the description of the embodiments or the prior art, and it will be apparent that the accompanying drawings in the description below are merely some of the embodiments of the present disclosure, and other drawings may be made to those skilled in the art without any inventive effort.

Figure 1:
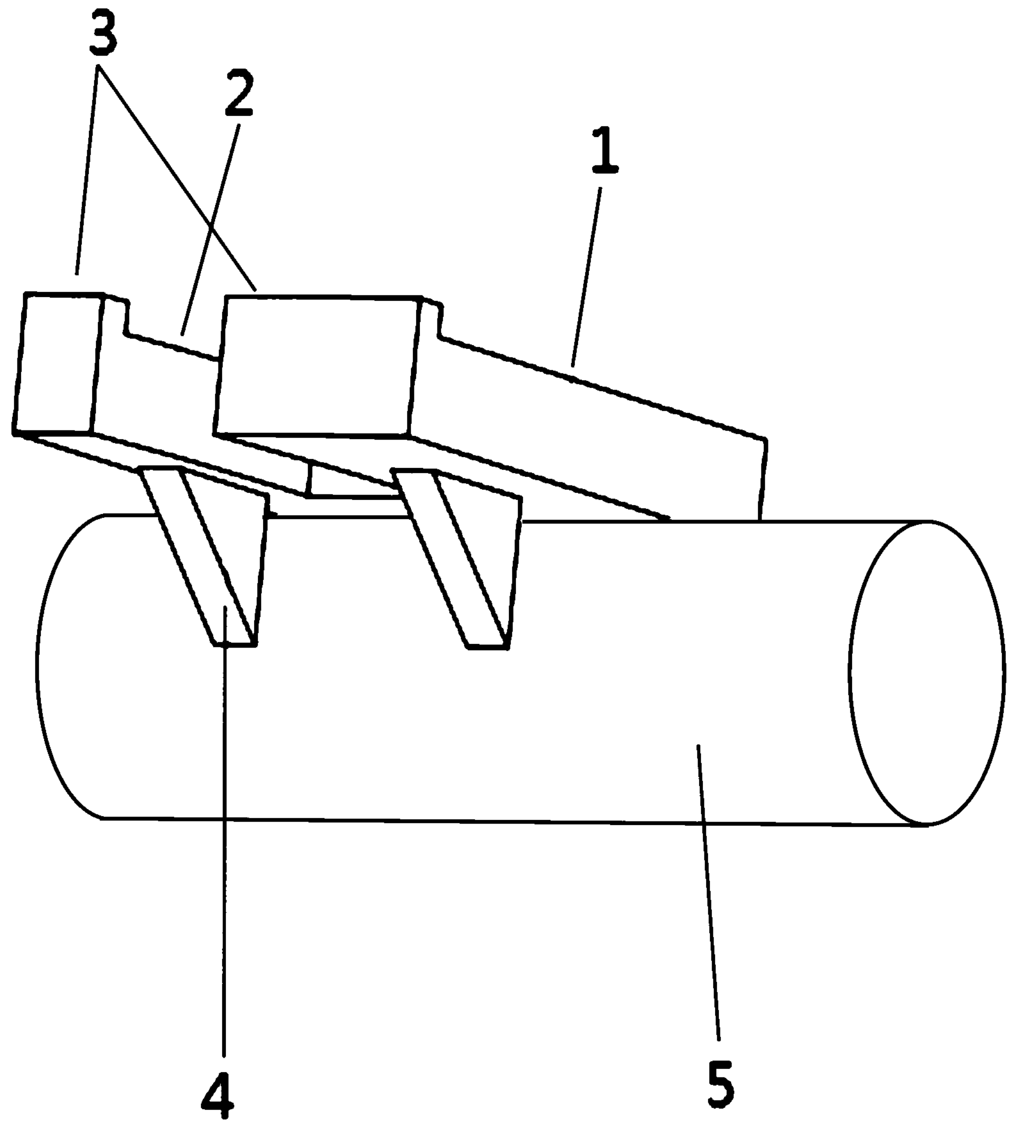
FIG. 1 is a schematic structural diagram of a suspended lifting device for diversion cylinder according to an embodiment of the present disclosure.

| LIST OF REFERENCE SIGNS | | |
|---|---|---|
| 1: lifting beam; | 2: groove; | 3: projection; |
| 4: positioning plate; | 5: water-cooling cross arm; | 6: lifting bolt; |
| 7: nut. | | |

DETAILED DESCRIPTION OF THE EMBODIMENTS

In order that the above objects, features and advantages of the present disclosure may be more readily understood, reference will now be made in detail to the accompanying drawings. In the following description, numerous specific details are set forth in order to facilitate a thorough understanding of the present disclosure. However, the present disclosure can be practiced in many other ways than those described herein, and those skilled in the art can make similar modifications without departing from the spirit of the present disclosure, and thus the present disclosure is not limited to the specific embodiments disclosed below.

In the description of this disclosure, it should be understood that the azimuth or positional relationship indicated by the terms "center", "longitudinal", "transverse", "length", "width", "thickness", "up", "down", "front", "back", "left", "right", "vertical", "horizontal", "top", "bottom", "inner", "outer", "clockwise", "counterclockwise", "axial", "radial", "circumferential", and the like, is based on the azimuth or positional relationship shown in the accompanying drawings, merely for case of description of this disclosure and simplification of the description, and is not intended to indicate or imply that the indicated device or element must have a particular azimuth, be constructed and operated in a particular azimuth, and therefore is not to be construed as limiting of this disclosure.

Furthermore, the terms "first" and "second" are used for descriptive purposes only and are not to be construed as indicating or implying relative importance or implying the number of indicated technical features. Thus, the features with "first" and "second" indicate or imply to have at least one of these features. In the description herein, "a plurality of" means at least two, e.g., two, three, etc., unless expressly and specifically defined otherwise.

In the present disclosure, unless expressly defined and defined otherwise, terms such as "mounted", "linked", "connected", "fixed", and the like, should be understood as a border meaning, for example, may be fixedly connection, detachably connection, or a integrally connection; may be a mechanical connection or an electrical connection; may be a directly connection or an indirectly connection by means of an intermediate medium; and may be an internal communication of the two elements or interaction of the two elements, unless expressly defined otherwise. The specific meaning of the above terms in this disclosure may be understood by one of ordinary skill in the art depending on the specific circumstances.

In the present disclosure, unless expressly stated and defined otherwise, the first feature may be "on" or "under" the second feature may mean that the first feature directly contacts with the second feature or indirectly contacts with the second feature through an intermediate medium. And the first feature may be "over", "above" or "up" the second feature may mean that the first feature may be directly above or obliquely above the second feature, or merely indicate that the first feature is higher than the second feature. The first feature may be "beneath", "below" or "down" the second feature may mean that the first feature may be directly above or obliquely under the second feature, or merely indicate that the first feature is shorter than the second feature.

It should be noted that when an element is referred to as being "fixed to" or "disposed in" another element, it means that the element may be directly on another element or an intermediate element may be disposed therebetween. When an element is considered to "be connected to" another element, it means that the element may be directly connected to another element or an intermediate element may be connected therebetween. As used herein, the terms "vertical", "horizontal", "up", "down", "left", "right", and the like are used for purposes of illustration only and are not intended to be the only embodiments.

In practical applications, a diversion cylinder plays a main role to isolate heat radiation from a heater to a single crystal, thereby ensuring temperature gradient required for a growth of the single crystal, ensuring stable crystal-formation rate of the single crystal, and ensuring a flow direction of protective gas in a furnace. As such, a vortex is avoided, a gas flow rate on a surface of a liquid is accelerated, and an impurity is increasingly volatilized.

Figure 2:
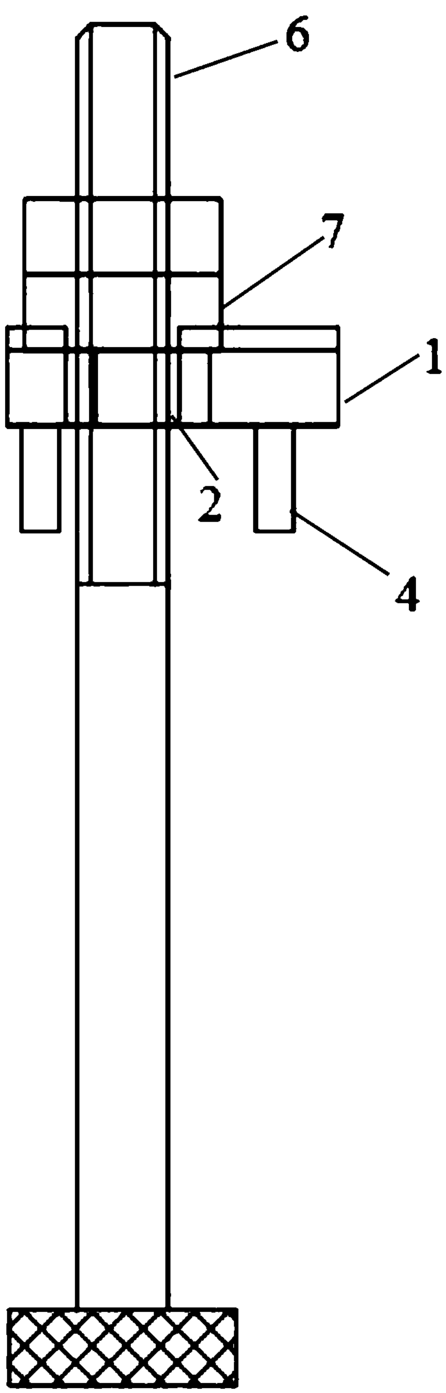
FIG. 2 is a front view of an assembly of a lifting bolt and a suspended lifting device for diversion cylinder according to an embodiment of the present disclosure.

A lifting beam is designed to be used with a suspended diversion cylinder. As shown in FIG. 1 and FIG. 2, a lifting device for suspended diversion cylinder includes a lifting beam 1.

The lifting beam 1 is connected to a surface of a water-cooling cross arm 5, and a groove 2 for receiving a lifting bolt 6 is provided on the lifting beam 1.

The lifting beam 1 is made of stainless steel and is adaptable for all thermal fields. The lifting beam 1 is integrally U-shaped and suspended from the water-cooling cross arm 5. The lifting bolt 6 is supported by the lifting beam 1 in U-shaped. The lifting beam 1 is cooperated with the lifting bolt 6 to lift or lower the diversion cylinder.

In an embodiment, the number of lifting beams 1 corresponds to the number of lifting bolts.

In an embodiment, a positioning plate 4 is disposed on a bottom side of the lifting beam 1 close to the water-cooling cross arm 5, and the positioning plate 4 is configured to control an angle between the lifting beam 1 and the water-cooling cross arm 5.

In an embodiment, in a case that a length of the lifting beam 1 is X, and a diameter of the water-cooling cross arm 5 is Y. X and Y satisfy with $1.5Y<X\leq 3Y$. That is, the length of the lifting beam 1 is greater than 1.5 times of the diameter of the water-cooling cross arm 5 and is less than 3 times of the diameter of the water-cooling cross arm 5. The length X of the lifting beam 1 may be greater than 75 mm and less than 150 mm, the diameter Y of the water-cooling cross arm 5 may be greater than 50 mm. For different diameters of the water-cooling cross arm 5 in different thermal fields, the length of the lifting beam 1 may be provided in this range. Although the device may be applied for different thermal fields, the lifting beam 1 with a too long length is easily bent. As a result, an accuracy on lifting the diversion cylinder is reduced, and the quality of the single crystal is reduced. To avoid a reduced accuracy on lifting the diversion cylinder and a reduced quality of the single crystal, in an embodiment, the lifting beam 1 may be provided as a retractable lifting beam to satisfy with the requirement on different lengths.

The groove 2 is provided on the lifting beam 1. The groove 2 extends through a front side of the lifting beam 1 away from the water-cooling cross arm 5 to define the lifting beam 1 U-shaped as a whole. The groove 2 is also a U-shaped groove, and a width of the groove 2 matches a size of a portion of the lifting bolt 6 to be disposed in the groove 2. It should be understood that the width of the groove 2 is a distance between two side walls of the U-shaped groove 2, and the side walls of the groove 2 are provided by the lifting beam 1. Generally, the width of the groove 2 is slightly greater than a diameter of the lifting bolt 6, and is less than a diameter of a nut 7 screwed with the lifting bolt 6.

In an embodiment, in a case that the diameter of the lifting bolt 6 is D (i.e., an opening of a carbon insulation cover), the width of the groove 2 is D+3 mm and the depth of the groove 2 is 4D-6D. The diameter D of the lifting bolt 6 may be greater 5 mm. It should be understood that the depth of the groove 2 is a distance of an opening side of the groove 2 to a bottom of the groove 2 opposite to the opening side. Thus, the width of the groove 2 and the depth of the groove 2 match the diameter of the lifting bolt 6, thereby providing a sufficient space for the lifting bolt 6 to move.

In an embodiment, in order to better match the lifting bolt 6, inners of the two side walls of the groove 2 are provided with arcuate surfaces to perfectly receive the lifting bolt 6 in the groove 2. As such, the lifting bolt 6 is prevented from falling out of the lifting device during movement.

An upper side of the positioning plate 4 is connected to the bottom side of the lifting beam 1 close to the water-cooling cross arm 5, a rear side of the positioning plate 4 is in contact with water-cooling cross arm 5, and the upper side of the positioning plate 4 is perpendicular to the rear side of the positioning plate 4. Generally, the upper side of the positioning plate 4 is welded to the bottom side of the lifting beam 1, and the rear side of the positioning plate 4 (the side contacting with the water-cooling cross-arm 5) is perpendicular to the rear side of the positioning plate 4. The positioning plate 4 may be a plate with an isosceles right triangle shape or a steel angle with a vertical angle shape to ensure the lifting beam 1 paralleled to a cross-section of the water-cooling cross-arm 5.

In an embodiment, a width of the upper side of the positioning plate 4 is greater than a half of a width of the side wall of the groove, i.e., is greater than a half of a width of a portion of the lifting beam defined as the side wall of the groove, to provide a stable fixing of the lifting beam 1.

In an embodiment, a projection 3 is provided on the front side of lifting beam 1, and the projection 3 is configured to prevent the lifting bolt 6 from falling down. The number of the projections 3 may be at least one, as long as the lifting bolt 6 is prevented from falling by the number of the projection. A shape of the projection 3 is not limited, as long as the lifting bolt 6 is prevented from falling by the shape of the projection. Generally, the shape of the projection 3 is designed as rectangular for practical and aesthetic purpose.

In an embodiment, the projection 3 is protruded from the lifting beam 1, and a distance of the projection 3 protruding from the lifting beam 1 is 3 mm to 5 mm. The height of the projection 3 may be adjusted according to the lifting bolt 6 for different thermal fields.

The lifting bolt 6 described above is conventional bolt with an aperture matching the needs.

The lifting device for the diversion cylinder as described above changes a lifting mode of the diversion cylinder, a horizontal deviation of the diversion cylinder during lifting is reduced, wherein a value of the horizontal deviation of the diversion cylinder is reduced from 11% to 5%. Meanwhile, a position deviation of a temperature-stabilizing crucible is reduced, the crystal-formation rate is improved, and the yield is improved. The lifting bolt 6 is blocked by the projection 3 from leaving the groove 2 during lifting, thereby avoiding an occurrence of anomalies.

The embodiments of the present disclosure have been described in detail above, but the description is only a preferred embodiment of the present disclosure and should not be considered as limiting the scope of implementation of the present disclosure. All equivalents and modifications made in accordance with the scope of the present disclosure is within the scope of the patent of the present disclosure.

What is claimed is:

1. A suspended lifting device for diversion cylinder, comprising:

a lifting beam connected to a surface of a water-cooling cross arm, wherein a first surface of the lifting beam is in direct contact with the water-cooled cross arm, and a second surface of the lifting beam opposite to the first surface is provided with a groove, a length direction of the lifting beam is perpendicular to an axial extension direction of the water-cooling cross arm, and the groove is configured to receive a lifting bolt;

wherein a positioning plate is disposed on the first surface of the lifting beam, a first side of the positioning plate is welded to the first surface of the lifting beam, and a second side of the positioning plate perpendicular to the first side is in contact with the water-cooling cross arm, and the positioning plate is configured to control an angle between the lifting beam and the water-cooling cross arm.

2. The suspended lifting device for diversion cylinder of claim 1, wherein a length of the lifting beam is X and a diameter of the water-cooling cross arm is Y, wherein X and Y satisfy with $1.5Y<X\leq 3Y$.

3. The suspended lifting device for diversion cylinder of claim 1, wherein the groove extends through a front side of the lifting beam to define the lifting beam U-shaped as a whole.

4. The suspended lifting device for diversion cylinder of claim 3, wherein the groove is U-shaped.

5. The suspended lifting device for diversion cylinder of claim 1, wherein inners of side walls of the groove are provided with arcuate surfaces to match the lifting bolt.

6. The suspended lifting device for diversion cylinder of claim 1, wherein a width of the groove matches a portion of the lifting bolt disposed in the groove.

7. The suspended lifting device for diversion cylinder of claim 6, wherein the width of the groove is greater than a diameter of the lifting bolt.

8. The suspended lifting device for diversion cylinder of claim 7, wherein the width of the groove is less than a diameter of a nut screwed with the lifting bolt.

9. The suspended lifting device for diversion cylinder of claim 8, wherein the diameter of the lifting bolt is D, and the width of the groove satisfies with D+3 mm.

10. The suspended lifting device for diversion cylinder of claim 9, wherein a depth of the groove satisfies with 4D-6D.

11. The suspended lifting device for diversion cylinder of claim 1, wherein a width of the first side of the positioning plate is greater than a half of a width of a portion of the lifting beam defined as a side wall of the groove.

12. The suspended lifting device for diversion cylinder of claim 1, further comprising a projection for preventing the lifting bolt from falling, wherein the projection is provided on a front side of the lifting beam.

13. The suspended lifting device for diversion cylinder of claim 12, wherein the projection is protruded from the lifting beam.

14. The suspended lifting device for diversion cylinder of claim 13, wherein a distance of the projection protruding from the lifting beam is 3 mm to 5 mm.

15. The suspended lifting device for diversion cylinder of claim 10, further comprising a projection for preventing the lifting bolt from falling, wherein the projection is provided on a front side of the lifting beam.

16. The suspended lifting device for diversion cylinder of claim 15, wherein a distance of the projection protruding from the lifting beam is 3 mm to 5 mm.

17. The suspended lifting device for diversion cylinder of claim 11, further comprising a projection for preventing the lifting bolt from falling, wherein the projection is provided on a front side of the lifting beam.

18. The suspended lifting device for diversion cylinder of claim 17, wherein a distance of the projection protruding from the lifting beam is 3 mm to 5 mm.

19. The suspended lifting device for diversion cylinder of claim 2, wherein the lifting beam is retractable with the length X of the lifting beam ranging in $1.5Y<X\leq 3Y$.

* * * * *